United States Patent
Chung et al.

(10) Patent No.: US 9,167,735 B2
(45) Date of Patent: Oct. 20, 2015

(54) METHOD FOR MANUFACTURING ELECTROMAGNETIC INTERFERENCE SHIELDING FILM

(75) Inventors: Kwang Choon Chung, Yongin-si (KR); Hyun Nam Cho, Gunpo-si (KR); Myung Bong Yoo, Yongin-si (KR); Nam-Boo Cho, Anyang-si (KR); Seok Pil Jin, Pyeongtaek-si (KR); Seong Hoon No, Pyeongtaek-si (KR)

(73) Assignee: Inktec Co., Ltd., Ansan-si, Kyeongki-do (KR)

( * ) Notice: Subject to any disclaimer, the term of this patent is extended or adjusted under 35 U.S.C. 154(b) by 395 days.

(21) Appl. No.: 13/805,843

(22) PCT Filed: Nov. 12, 2010

(86) PCT No.: PCT/KR2010/008009
§ 371 (c)(1), (2), (4) Date: Mar. 14, 2013

(87) PCT Pub. No.: WO2011/162453
PCT Pub. Date: Dec. 29, 2011

(65) Prior Publication Data
US 2013/0206315 A1    Aug. 15, 2013

(30) Foreign Application Priority Data

Jun. 23, 2010  (KR) .......... 10-2010-0059673
Nov. 12, 2010  (KR) .......... 10-2010-0112970

(51) Int. Cl.
    H05K 9/00    (2006.01)
(52) U.S. Cl.
    CPC ............ *H05K 9/0088* (2013.01); *Y10T 156/10* (2015.01)

(58) Field of Classification Search
    CPC .................................... H05K 9/0088
    See application file for complete search history.

(56) References Cited

U.S. PATENT DOCUMENTS

| 7,709,750 B2 * | 5/2010 | Hashimoto et al. ........ 174/378 |
| 8,445,578 B2 | 5/2013 | Chung et al. |
| 2011/0154948 A1 | 6/2011 | Chung et al. |

FOREIGN PATENT DOCUMENTS

| JP | 2009194359 A | * | 8/2009 |
| KR | 100727483 B1 | | 6/2007 |
| KR | 1020070110369 A | | 11/2007 |
| KR | 1020080015447 A | | 2/2008 |
| KR | 1020100024295 A | | 3/2010 |

* cited by examiner

*Primary Examiner* — Daniel Lee
(74) *Attorney, Agent, or Firm* — The Webb Law Firm (57) ABSTRACT

Provided is a method for manufacturing an electromagnetic interference (EMI) shielding film, including: (a) providing a single insulating layer on a first protective film, the insulating layer being made of an insulating layer composition including at least one resin selected from a thermoplastic resin and a thermosetting resin and at least one filler selected from a flame-retardant filler and an abrasion-resistant filler; (b) providing a metal layer on the insulating layer; (c) providing a conductive adhesive layer on the metal layer, the conductive adhesive layer being made from a conductive adhesive layer composition including at least one resin selected from a thermoplastic resin and a thermosetting resin and a conductive filler; and (d) providing a second protective film on the conductive adhesive layer, and an EMI shielding film manufactured by the method.

17 Claims, 1 Drawing Sheet

METHOD FOR MANUFACTURING ELECTROMAGNETIC INTERFERENCE SHIELDING FILM

TECHNICAL FIELD

The present invention relates to a method for manufacturing an electromagnetic interference (EMI) shielding film, which is used in a printed circuit board (PCB) or a flexible printed circuit board (FPCB) in order to shield electromagnetic interference generated in electronic parts and devices, and an electromagnetic interference (EMI) shielding film manufactured thereby.

BACKGROUND ART

As electronic devices are getting smaller and lighter, demands for downsizing parts applied to printed circuit boards are increasing. In addition, a high degree in design freedom and excellent flexibility are required in order to be suitable for high-density wiring. Moreover, electronic devices are operated at higher performance and higher speed, resulting in generation of noise due to higher frequency. Therefore, the focus of developing EMI shielding materials has become even more important.

Shielding methods of these electronic devices may be classified into a shielding film type, a type where silver paste is coated on a printed circuit board, and a sputtering type where metal particles are attached on a printed circuit board. Considering process workability, reliability, and higher performance, a film-type shielding method is advantageous.

As an example of an EMI shielding film according to the related art, Korean Patent Laid-Open Publication No. 10-2008-0015447 discloses an EMI shielding film that includes a separating film; a release layer; a double-layer structured cover film consisting of a hard layer and a soft layer; a metal layer; and a conductive adhesive layer.

However, this EMI shielding film is easily torn at the time of FPCB processing because the cover film is brittle, resulting in delamination of the cover film and the metal layer from each other. As a result, a plating solution infiltrates into the EMI shielding layer, thereby causing problems in chemical resistance of the EMI shielding film.

Furthermore, this EMI shielding film is easily released from a flexible printed circuit board (FPCB) at the time of prior lamination with the FPCB since the conductive adhesive agent has low adhesive strength at room temperature.

As another example of an EMI shielding film according to the related art, Korean Patent Laid-Open Publication No. 10-2007-0110369 discloses an EMI shielding film that includes a reinforcing film; a slight adhesive layer; a base film; and a curable conductive adhesive layer containing a poly urethane-poly urea resin, an epoxy resin having two or more epoxy groups, and a conductive filler.

This EMI shielding film is designed such that a shielding performance is given to the conductive adhesive layer, since there are no interlayer metal layers and the conductive adhesive agent is prepared in an isotropic type from an anisotropic type. However, when this EMI shielding film is long flexed, a film formed by metal particles is easily cut, and thus the EMI shielding performance cannot be maintained.

DISCLOSURE

Technical Problem

An object of the present invention is to provide a method for manufacturing an EMI shielding film, which can maintain a shielding performance even during a long flexure; have high flexibility and excellent reliability at the time of FPCB processing, for example, excellent chemical resistance and excellent heat resistance of withstanding high temperatures at the time of solder reflow; and be very easily attached on the FPCB, and an EMI shielding film manufactured thereby.

Technical Solution

In one general aspect, a method for manufacturing an electromagnetic interference (EMI) shielding film, includes: (a) providing a single insulating layer on a first protective film, the insulating layer being made of an insulating layer composition including at least one resin selected from a thermoplastic resin and a thermosetting resin and at least one filler selected from a flame-retardant filler and an abrasion-resistant filler; (b) providing a metal layer on the insulating layer; (c) providing a conductive adhesive layer on the metal layer, the conductive adhesive layer being made from a conductive adhesive layer composition including at least one resin selected from a thermoplastic resin and a thermosetting resin and a conductive filler; and (d) providing a second protective film on the conductive adhesive layer.

In another general aspect, an electromagnetic interference (EMI) shielding film manufactured by the method is provided.

Advantageous Effects

According to the present invention, there is provided a method for manufacturing an EMI shielding film, which has superior EMI shielding performance, high flexibility, and excellent chemical resistance, heat resistance and tearing-resistance, and which can be very easily attached on an FPCB.

More specifically, in the present invention, in a case where, as the first protective film, a non-silicon based matte release film is used, the first protective film can have high adhesive strength with the insulating layer and provide a quenching effect to the insulating layer.

In the present invention, in a case where the insulating layer is formed as a single layer in B-stage, the insulating layer can have improved flexibility and adhesive strength with a metal layer, exhibit a cushion property due to generation of sufficient flow at the time of heating and compressing, and inflow into and fill up height difference parts of the FPCB.

In the present invention, in a case where the metal layer is formed by a coating method by using a silver (Ag) ink coating solution, peel problems with the insulating layer and deteriorated flexibility problems, which result from forming of the metal layer by the existing methods such as sputtering or deposition, can be solved. More specifically, in a case where the silver (Ag) ink coating solution infiltrates into the insulating layer in B-stage and then is subjected to firing, the metal layer can maintain a high peel strength, and thus, it can be prevented from being torn due to peeling-off between layers at the time of FPCB processing. In addition, in a case where the metal layer is formed through the coating method by using the silver (Ag) ink coating solution, productivity can be improved as compared with the existing methods.

In the present invention, in a case where the conductive adhesive layer contains silver (Ag) having excellent conductivity and a polyester resin having excellent adhesive strength with the metal layer, it can have high flexibility and high conductivity.

DESCRIPTION OF DRAWINGS

The above and other objects, features and advantageous of the present invention will become apparent from the following description in conjunction with the accompanying drawing, in which.

DETAILED DESCRIPTION OF MAIN ELEMENTS

10: SECOND PROTECTIVE FILM
20: CONDUCTIVE ADHESIVE LAYER
30: METAL LAYER
40: INSULATING LAYER
50: FIRST PROTECTIVE FILM

BEST MODE

A method for manufacturing an electromagnetic interference (EMI) shielding film, according to the present invention, includes: (a) providing a single insulating layer on a first protective film, the insulating layer being made of an insulating layer composition including at least one resin selected from a thermoplastic resin and a thermosetting resin and at least one filler selected from a flame-retardant filler and an abrasion-resistant filler; (b) providing a metal layer on the insulating layer; (c) providing a conductive adhesive layer on the metal layer, the conductive adhesive layer being made from a conductive adhesive layer composition including at least one resin selected from a thermoplastic resin and a thermosetting resin and a conductive filler; and (d) providing a second protective film on the conductive adhesive layer.

The first protective film of the step (a) may be a matte release film. Any typical release film, if it is matte, may be variously applied in the present invention. As such, it is advantageous to use the matte release film in view of providing a quenching effect to the insulating layer.

An example of the first protective film may include a non-silicon based matte release film. This film is not easily peeled off the insulating layer. In addition, when the insulating layer composition is coated on the matte release film, this film imparts a matte effect to the insulating layer, thereby providing the quenching effect to the insulating layer. Furthermore, this film can minimize the generation of heat due to friction, and thus exhibiting excellent flexibility.

In addition, as a result of the matte effect of the insulating layer, a peel strength between the insulating layer and the metal layer can be improved when, for example, a silver (Ag) coating solution, is coated on the insulating layer in order to form the metal layer on the insulating layer.

The first protective film of the step (a), for example, in a case where a non-silicon based matte release film is used, preferably has a thickness of 35 to 90 µm, in view of solving the shrinkage problem generated after coating the insulating layer thereon and improving the FPCB workability.

The first protective film of the step (a) has adhesive strength with the insulating layer of, preferably 180 gf/in or more, more preferably 200 gf/in or more, and even more preferably 200 gf/in or more and less than 250 gf/in.

If adhesive strength of the first protective film is lower than the above range, the first protective film is more easily peeled off than the second protective film attached on the conductive adhesive layer, and thus it is impossible to perform a pre-bonding process of temporarily bonding the first protective film on a printed circuit board in a detachable type. Meanwhile, if adhesive strength of the first protective film is higher than the above range, the first protective film is difficult to remove after it is bonded on the printed circuit board through hot press.

In a case where the insulating layer composition of the step (a) may further include a supplemental additive and a solvent, the insulating layer composition of the step (a) may contain 10 to 80 wt % of the resin, 2 to 20 wt % of the filler, 0.5 to 10 wt % of the supplemental additive, and 5 to 80 wt % of the solvent, based on total 100 wt % thereof.

In the insulating layer composition of the step (a), at least one resin selected from a thermoplastic resin and a thermosetting resin may be used as the resin. Preferably, a polyester resin or polyurethane resin with heat resistance may be used, and in this case, this resin can have improved adhesive strength with the metal layer and excellent flexibility. In a case where an epoxy resin with excellent heat resistance is used, this resin can exhibit excellent lead-free solder reflow characteristics, and cannot be easily torn at the time of FPCB processing. In addition, heat-resistant polyester resin and polyurethane resin may be used together.

The flame-retardant filler of the step (a) may include at least one selected from aluminum hydroxide, a phosphorous compound, calcium hydroxide, and zinc hydroxide.

The abrasion-resistant filler of the step (a) may include at least one selected from titanium hydroxide, silica, zirconium oxide, and zinc oxide.

Here, in a case where the flame-retardant filler and abrasion-resistant filler are added together, they are preferably added in total 2 to 20 wt %.

In the insulating layer composition of the step (a), when the supplemental additive is added into the insulating layer composition, typical function—improving additives known to the art to which the present invention pertains may be used. Specific examples thereof may include an adhesion promoter or the like, such as an organomodified silicon wetting agent, a non-ionic leveling agent, a phosphate compound, amino trimethyl silane, polythiol, a coupling agent, or the like, but are not limited thereto.

The step (a) may include: (a1) preparing the insulating layer composition; (a2) coating the insulating layer composition on the first protective film to form a coating layer; and (a3) drying the coating layer to form an insulating layer in B-stage on the first protective film.

The insulating layer composition in the step (a2) may be coated on the first protective film by a method of comma coating, gravure coating, slot die coating, microgravure coating, or the like. As an example of the present invention, the insulating layer composition may be coated on the first protective film by the microgravure coating, and then dried at a temperature of 120° C. for 5 minutes, to form the insulating layer in B-stage.

Here, when the insulating layer is formed in B-stage, not C-stage, sufficient flow occurs in the insulating layer at the time of heating and compressing, and thus the insulating layer can exhibit a cushion property. Therefore, the insulating layer inflows into and fills up height difference parts of the FPCB, thereby increasing adhesive strength with the FPCB.

The insulating layer in the step (a) may have a thickness of 3 µm to 20 µm, and preferably 5 µm to 15 µm. If a thickness of the insulating layer is smaller than the above range, the insulating layer has lowered resin flowability and thus, it may be torn by height differences in circuits of the printed circuit board. If a thickness of the insulating layer is larger than the above range, the insulating layer may have lowered ductility, resulting in lowered slide flexibility.

The metal layer in the step (b) means a silver (Ag) ink coating solution.

The silver (Ag) ink coating solution may contain a silver chelate compound obtained by reacting at least one silver compound of chemical formula 1 below and at least one ammonium carbamate-based compound or ammonium carbonate-based compound selected from chemical formulas 2 to 4 below.

[Chemical Formula 1]
[Chemical Formula 2]
[Chemical Formula 3]
[Chemcial Formula 4]

In the chemical formulas, X represents a substituent selected from oxygen, sulfur, halogen, cyano, cynate, carbonate, nitrate, nitrite, sulfate, phosphate, thiocyanate, chlorate, perchlorate, tetrafluoroborate, acetylacetonate, carboxylate and derivatives thereof, n represents an integer of 1 to 4, and each of R1 to R6 represents independently hydrogen, C1-C30 aliphatic or cycloaliphatic alkyl, aryl or aralkyl group, alkyl or aryl group substituted with a functional group, and a substituent selected from a heterocyclic compound, a high molecular compound and a derivative thereof, but R1 to R6 are not all hydrogen.

As for the silver ink coating solution used herein, a preparing method thereof is described in Korean Patent No. 10-0727483, filed by the present inventors, and thus, details thereof will be omitted.

The step (b) may include: (b1) preparing the silver (Ag) ink coating solution; (b2) coating the silver (Ag) ink coating solution on the insulating layer; and (b3) performing firing to form the metal layer on the insulating layer, after the step (b2).

In the step (b2), as a method for coating the silver (Ag) ink coating solution on the insulating layer, gravure coating, flexo-coating, slot die coating, and microgravure coating may be used.

In the step (b3), any condition under which the coated silver coating solution can be transformed into silver metal at the time of firing is not largely limited, but generally, the firing may be performed at 60 to 200° C. for 10 seconds to 20 minutes. As an example of the present invention, the silver (Ag) ink coating solution may be coated on the insulating layer by the microgravure coating, and then subjected to firing at 150° C. for 5 minutes, to form a silver (Ag) metal layer.

The metal layer of the step (b) may have a thickness of 0.05 μm to 0.4 μm, and preferably 0.15 μm to 0.3 μm.

If a thickness of the metal layer is smaller than the above range, an EMI shielding performance may be lowered. Meanwhile if the metal layer has a large thickness, an EMI shielding performance may be high, but the metal layer may have lowered flexibility due to lowered ductility thereof.

As such, the silver (Ag) ink coating solution having high EMI shielding efficiency is used to form the metal layer by coating, and thus, products having excellent abrasion-resistance, adhesive strength, and flexibility can be manufactured by even a single insulating layer, differently from the related art where an insulating layer with a two-layer structure including an anchor layer or the like for improving adhesive strength needs to be provided while the metal layer is formed by deposition or sputtering. More specifically, in a case of deposition or sputtering, which is the existing method of forming a metal layer, the metal layer has a low peel strength with the insulating layer, resulting in peeling-off between the insulating layer and the metal layer at the time when an FPCB is flexed, and the metal layer has lowered flexibility due to metal particles and has risks of breakage and damage. Accordingly, this metal layer is limited to be applied in processing of the FPCB having height differences, that is, high wiring thickness of PCB, or manufacturing of products requiring flexibility.

However, in the present invention, the silver (Ag) ink coating solution is not in a metal state before it is fired, and exists as a solution type of organic Ag complex. More specifically, silver (Ag) exists in an atom state within the solution. Then, when the insulating layer is wetted with ink at the time of coating, flowability occurs in the insulating layer of B-stage during a heat treatment process, and thereby, the silver (Ag) ink coating solution infiltrates into the insulating layer to be physically fixed thereto, and at the same time, the silver (Ag) reacts with functional groups of resin, such as carboxyl (COOH), amine (NH2), hydroxy (OH) groups and the like, thereby improving the peel strength through chemical binding.

In addition, since the metal layer has silver (Ag) particles, which have uniformly smaller size than the existing metal particles, and exhibits ductility, it has excellent flexibility.

In addition, since the metal layer of the present invention, which is not a single metal layer formed by deposition or sputtering, is formed in a fine silver (Ag) particle connection structure (multilayer), spreading of crack significantly slows in the metal layer at the time when the metal layer is flexed, thereby maintaining excellent shielding performance.

Meanwhile, as another example of the silver (Ag) ink coating solution used in the step (b), an aluminum trihydroxide (ATH)—composite coating solution is developed, which can impart flame retardancy to the film, and silver (Ag) complexes are distributed in an ATH matrix at the time of coating of the silver (Ag) complex, thereby allowing a silver (Ag) film to prevent crack due to heat.

In a case where the conductive adhesive layer composition of the step (c) may further include a solvent, the conductive adhesive layer composition may contain 10 to 60 wt % of the resin, 10 to 30 wt % of the conductive filler, and 30 to 60 wt % of the solvent, based on total 100 wt % thereof.

In a case where the conductive adhesive layer composition of the step (c) may further include a supplemental additive and a solvent, the conductive adhesive layer composition may contain 10 to 60 wt % of the resin, 10 to 30 wt % of the conductive filler, 1 to 7 wt % of the supplemental additive, and 29 to 60 wt % of the solvent, based on total 100 wt % thereof.

In addition, in the present invention, the supplemental additive of the step (c) may further include at least one component selected from a thermosetting agent, a flame-retardant phosphorous compound, and a metal adhesion improver.

As the metal adhesion improver, an Al-based coupling agent, a Ti-based coupling agent, or a thiol compound may be used. Specific examples of the metal adhesion improver may include an organomodified silane-based attachment enhancer, such as trimethoxy propyl silane, vinyl triethoxy silane, mercapto trimethoxy silane, or the like, and a chelate compound, such as a thiol compound, an alkyl compound containing a sulfone group, or the like, but are not limited thereto.

The metal adhesion improver has a content of, preferably 1 to 5 wt %, and more preferably 1.5 to 3 wt %.

If a content of the metal adhesion improver is smaller than the above range, an effect in improvement of adhesive strength may be small. If a content of the metal adhesion improver is larger than the above range, adhesive strength may be lowered. As such, adding of the metal adhesion improver can improve peel strength (adhesive strength) of the metal layer and the conductive adhesive layer.

As the thermosetting agent, isocyanate, dicyanamide, triethylenetetramine, dicyandiamide, imidazole, urea resin, or the like may be used.

In the conductive adhesive layer composition of the step (c), as the resin, at least one resin selected from a thermoplastic resin and a thermosetting resin may be used, and preferably, a polyester resin, an epoxy resin, and the urethane resin may be used, either alone or by mixing.

In the conductive adhesive layer composition of the step (c) as the conductive filler, spherical silver (Ag) or flake type silver (Ag) having excellent conductivity and high ductility may be used, either alone or by mixing.

The step (c) may include: (c1) preparing the conductive adhesive layer composition; (c2) coating the conductive adhesive layer composition on the metal layer to form the conductive adhesive layer; and (c3) drying the conductive adhesive layer to form a conductive adhesive layer in B-stage on the metal layer.

The conductive adhesive in the step (c2) has high viscosity, and it may be coated on the metal layer by comma coating, or by using a slot die coater.

The drying in the step (c3) may be performed at a temperature of 60 to 200° C. for 10 seconds to 20 minutes. As an example of the present invention, the conductive adhesive layer composition may be coated on the metal layer by the slot die coating, and then dried at 150° C. for 5 minutes, to form the conductive adhesive layer in B-stage.

As such, the conductive adhesive layer formed in the step (c) can be very easily pre-bonded to the printed circuit board.

In addition, the conductive adhesive layer in B-stage has superior flexibility. Therefore, at the time of application to products having high differences, this conductive adhesive layer can be softened by heating, thereby filling the height difference parts, and stably connected with ground circuits of the FPCB, thereby effectively shielding EMI noises from being emitted to the outside.

The conductive adhesive layer in the step (c) may have a thickness of 5 μm to 20 μm. If a thickness of the conductive adhesive layer is smaller than the above range, the conductive adhesive layer cannot fill up the height difference parts and thus it may be torn. If a thickness of the conductive adhesive layer is larger than the above range, the conductive adhesive layer may have lowered flexibility.

In the step (d), the second protective film may be provided on the conductive adhesive layer, by coating the conductive adhesive layer composition on the conductive metal layer in the step (c3) and then laminating the second protective film thereon.

The materials for the second protective film may be a silicon release coated PET film, and adhesive strength thereof is preferably in the range of 200 gf/in to 300 gf/in.

If adhesive strength of the second protective film is lower than the above range, the second protective film it may be easily peeled off and contaminated during pre-bonding working. If adhesive strength of the second protective film is higher than the above range, the first protective film may be peeled off first, and thus, it fails to perform the pre-bonding working.

The existing EMI shielding film is difficult to be peeled off by hand of a worker at the time of FPCB processing due to using of a strong adhesive type protective film. However, since the second protective film of the present invention has an appropriate release force, it can be very easily peeled off the conductive adhesive layer by hand of the worker.

Figure 1:
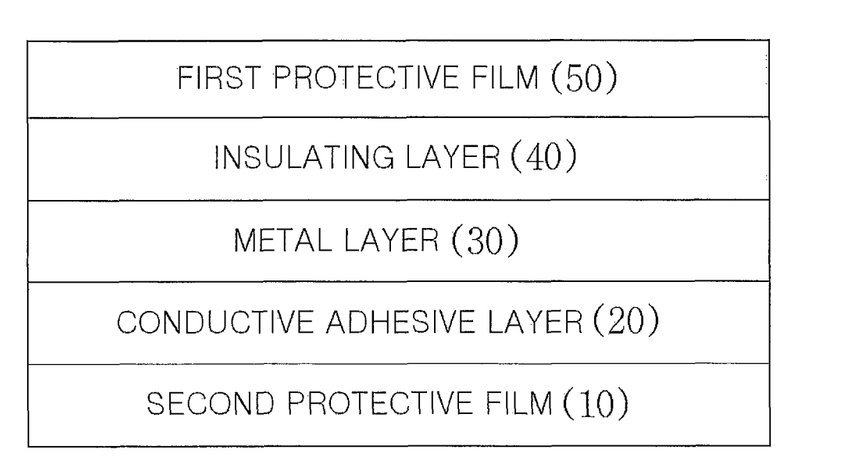
FIG. 1 is a cross-sectional view of an EMI shielding film according to the present invention.

An example of a method for manufacturing an EMI shielding film having this constitution will be explained with reference to FIG. 1, but it does not limit the scope of the present invention.

An insulating layer composition is coated on a first protective film (50), to form an insulating layer (40). A silver ink coating solution is coated on the insulating layer (40), followed by a firing process, thereby forming a silver (Ag) metal layer of thin film, as a metal layer (30), on the insulating layer (40).

Then, an anisotropic conductive adhesive composition is coated on this silver (Ag) metal layer (30), and dried in B-stage. Then, a second protective film (10) and the conductive adhesive layer (20) are laminated by using a heating laminator, thereby manufacturing a high functional EMI shielding film according to the present invention.

Meanwhile, the EMI shielding film according to the present invention may be manufactured by the above-described manufacturing method, thereby including a first protective film, an insulating layer, a metal layer, a conductive adhesive layer, and a second protective film.

Hereinafter, the present invention will be in detail described through examples, which do not limit the present invention. Unless stated with particular limitation, raw materials in examples and comparative examples were the same as those used in Example 1.

Example 1

18.0 wt % of bisphenol A epoxy resin (LG Chemical, LER 850S), 7.2 wt % of phenoxy epoxy resin (JER, 4275), 6.0 wt % of rubber-modified epoxy resin (LG chemical, TSR 960), 4.8 wt % of aluminum hydroxide (KC, average particle diameter; 1.0 μm), 3.6 wt % of dicyandiamide, 0.6 wt % of carbon black, 20 wt % of polyester resin (Burim Chemical, GR-HK4706), 10 wt % of polyurethane resin (Arakawa Chemical, U201), 3.0 wt % of silica (Gematech, Purisol-HM21MK, 50 nm), 20 wt % of cyclohexanone, and 6.8 wt % of MEK were mixed and dissolved to prepare an insulating layer coating solution.

The insulating layer coating solution was coated on a first release film (release force 200 gf/in) of non-silicon base, which is a matte type, as a first protective film, by using a microgravure coater, followed by drying at a temperature of 150° C. for 5 minutes, thereby forming an insulating layer in B-stage with a thickness of 5 μm.

Ag ink (Inktec, TEC-R2A) having a solid content of 13% was coated on the insulating layer by using the microgravure coater, followed by firing at a temperature of 150° C. for 5 minutes, thereby forming a silver (Ag) metal layer with a thickness of 0.3 μm.

20.0 wt % of polyester resin (Burim Chemical, GR-HK4706), 20.0 wt % of bisphenol A epoxy resin (LG Chemical, LER 850S), 5.0 wt % of Ag flake type powder (Metalor Technologies USA, particle; 3 μm), 10.0 wt % of Ag spherical particle powder (Yoo Chang Metal, SIA, average particle diameter; 5 μm), 2.0 wt % of mercapto trimethoxy silane (prepared by Dupont) as a metal adhesion improver, 30.0 wt % of cyclohexanone, 10.0 wt % of MEK, and 3.0 wt % of dicyandiamide were dispersed and mixed to obtain a curable conductive adhesive composition.

The curable conductive adhesive composition was coated on a surface of the silver (Ag) metal layer by using a slot die coater, followed by drying at a temperature of 150° C. for 5 minutes, thereby forming a conductive adhesive layer with a thickness of 13 μm. Then, a second release film (release force; 250 gf/in) of PET, which is coated with silicon, as a second protective film, was laminated on the conductive adhesive layer, thereby manufacturing an EMI shielding film.

Example 2

18.0 wt % of bisphenol A epoxy resin, 7.2 wt % of phenoxy epoxy resin, 6.0 wt % of rubber-modified epoxy resin, 4.8 wt % of aluminum hydroxide, 3.6 wt % of dicyandiamide, 0.6 wt % of carbon black, 30 wt % of polyester resin, 8.0 wt % of silica, 15 wt % of cyclohexanone, and 6.8 wt % of MEK were mixed and dissolved to prepare an insulating layer coating solution.

The insulating layer coating solution was coated on a first release film (release force 200 gf/in), which are non-silicon base and matte, as a first protective film, by using a microgravure coater, followed by drying at a temperature of 150° C. for 5 minutes, thereby forming a B-staged insulating layer with a thickness of 5 μm.

Ag ink having a solid content of 13% was coated on the insulating layer by using the microgravure coater, followed by firing at a temperature of 150° C. for 5 minutes, thereby forming a silver (Ag) metal layer with a thickness of 0.3 μm.

20.0 wt % of polyester resin, 20.0 wt % of bisphenol A epoxy resin, 10.0 wt % of Ag flake type powder, 5.0 wt % of Ag spherical particle powder, 2.0 wt % of mercapto trimethoxy silane (prepared by Dupont) as a metal adhesion improver, 30.0 wt % of cyclohexanone, 10.0 wt % of MEK, and 3.0 wt % of dicyandiamide were dispersed and mixed to obtain a curable conductive adhesive composition.

The curable conductive adhesive composition was coated on a surface of the silver (Ag) metal layer by using a slot die coater, followed by drying at a temperature of 150° C. for 5 minutes, thereby forming a conductive adhesive layer with a thickness of 13 μm. Then, a second release film (release force; 250 gf/in) of PET, which is coated with silicon, as a second protective film, was laminated on the conductive adhesive layer, thereby manufacturing an EMI shielding film.

Example 3

18.0 wt % of bisphenol A epoxy resin, 7.2 wt % of phenoxy epoxy resin, 6.0 wt % of rubber-modified epoxy resin, 4.8 wt % of aluminum hydroxide, 3.6 wt % of dicyandiamide, 0.6 wt % of carbon black, 30 wt % of polyester resin, 8.0 wt % of silica, 15 wt % of cyclohexanone, and 6.8 wt % of MEK were mixed and dissolved to prepare an insulating layer coating solution.

The insulating layer coating solution was coated on a first release film (release force 200 gf/in), which are non-silicon base and matte, as a first protective film, by using a microgravure coater, followed by drying at a temperature of 150° C. for 5 minutes, thereby forming a B-staged insulating layer with a thickness of 5 μm.

Ag ink having a solid content of 13% was coated on the insulating layer by using the microgravure coater, followed by firing at a temperature of 150° C. for 5 minutes, thereby forming a silver (Ag) metal layer with a thickness of 0.3 μm.

10.0 wt % of polyester resin, 30.0 wt % of bisphenol A epoxy resin, 15.0 wt % of Ag spherical particle powder, 2.0 wt % of mercapto trimethoxy silane (prepared by Dupont) as a metal adhesion improver, 30.0 wt % of cyclohexanone, 10.0 wt % of MEK, and 3.0 wt % of dicyandiamide were dispersed and mixed to obtain a curable conductive adhesive composition.

The curable conductive adhesive composition was coated on a surface of the silver (Ag) metal layer by using a slot die coater, followed by drying at a temperature of 150° C. for 5 minutes, thereby forming a conductive adhesive layer with a thickness of 13 μm. Then, a second release film (release force; 250 gf/in) of PET, which is coated with silicon, as a second protective film, was laminated on the conductive adhesive layer, thereby manufacturing an EMI shielding film.

Example 4

18.0 wt % of bisphenol A epoxy resin, 7.2 wt % of phenoxy epoxy resin, 6.0 wt % of rubber-modified epoxy resin, 4.8 wt % of aluminum hydroxide, 3.6 wt % of dicyandiamide, 0.6 wt % of carbon black, 30 wt % of polyester resin, 8.0 wt % of silica, 15 wt % of cyclohexanone, and 6.8 wt % of MEK were mixed and dissolved to prepare an insulating layer coating solution.

The insulating layer coating solution was coated on a first release film (release force 200 gf/in), which are non-silicon base and matte, as a first protective film, by using a microgravure coater, followed by drying at a temperature of 150° C. for 5 minutes, thereby forming a B-staged insulating layer with a thickness of 10 μm.

Ag ink having a solid content of 13% was coated on the insulating layer by using the microgravure coater, followed by firing at a temperature of 150° C. for 5 minutes, thereby forming a silver (Ag) metal layer with a thickness of 0.3 μm.

10.0 wt % of polyester resin, 30.0 wt % of bisphenol A epoxy resin, 15.0 wt % of Ag flake type powder, 2.0 wt % of mercapto trimethoxy silane (prepared by Dupont) as a metal adhesion improver, 30.0 wt % of cyclohexanone, 10.0 wt % of MEK, and 3.0 wt % of dicyandiamide were dispersed and mixed to obtain a curable conductive adhesive composition.

The curable conductive adhesive composition was coated on a surface of the silver (Ag) metal layer by using a slot die coater, followed by drying at a temperature of 150° C. for 5 minutes, thereby forming a conductive adhesive layer with a thickness of 13 μm. Then, a second release film (release force; 250 gf/in) of PET, which is coated with silicon, as a second protective film, was laminated on the conductive adhesive layer, thereby manufacturing an EMI shielding film.

Comparative Example 1

18.0 wt % of bisphenol A epoxy resin, 7.2 wt % of phenoxy epoxy resin, 6.0 wt % of rubber-modified epoxy resin, 4.8 wt % of aluminum hydroxide, 3.6 wt % of dicyandiamide, 0.6 wt % of carbon black, 30 wt % of polyester resin, 23 wt % of cyclohexanone, and 6.8 wt % of MEK were mixed and dissolved to prepare an insulating layer coating solution.

The insulating layer coating solution was coated on a first release film (release force 250 gf/in), which are non-silicon base and matte, as a first protective film, by using a microgravure coater, followed by drying at a temperature of 150° C. for 5 minutes, thereby forming a B-staged insulating layer with a thickness of 5 μm.

Ag ink having a solid content of 13% was coated on the insulating layer by using the microgravure coater, followed by firing at a temperature of 150° C. for 5 minutes, thereby forming a silver (Ag) metal layer with a thickness of 0.1 μm.

20.0 wt % of polyester resin, 20.0 wt % of bisphenol A epoxy resin, 15.0 wt % of Ag flake type powder, 30.0 wt % of cyclohexanone, 12.0 wt % of MEK, and 3.0 wt % of dicyandiamide were dispersed and mixed to obtain a curable conductive adhesive composition.

The curable conductive adhesive composition was coated on a surface of the silver (Ag) metal layer by using a slot die coater, followed by drying at a temperature of 150° C. for 5 minutes, thereby forming a conductive adhesive layer with a thickness of 8 μm. Then, a second release film (release force; 250 gf/in) as a second protective film was laminated on the conductive adhesive layer, thereby manufacturing an EMI shielding film.

Comparative Example 2

18.0 wt % of bisphenol A epoxy resin, 7.2 wt % of phenoxy epoxy resin, 6.0 wt % of rubber-modified epoxy resin, 4.8 wt % of aluminum hydroxide, 3.6 wt % of dicyandiamide, 0.6 wt % of carbon black, 30 wt % of polyester resin, 8.0 wt % of silica, 15 wt % of cyclohexanone, and 6.8 wt % of MEK were mixed and dissolved to prepare an insulating layer coating solution.

The insulating layer coating solution was coated on a first release film (release force 150 gf/in), which are non-silicon base and matte, as a first protective film, by using a microgravure coater, followed by drying at a temperature of 150° C. for 5 minutes, thereby forming a B-staged insulating layer with a thickness of 30 μm.

Ag ink having a solid content of 13% was coated on the insulating layer by using the microgravure coater, followed by firing at a temperature of 150° C. for 5 minutes, thereby forming a silver (Ag) metal layer with a thickness of 0.3 μm.

10.0 wt % of polyester resin, 30.0 wt % of bisphenol A epoxy resin, 5.0 wt % of Ag flake type powder, 10.0 wt % of Ag spherical particle powder, 0.5 wt % of mercapto trimethoxy silane (prepared by Dupont) as a metal adhesion improver, 30.0 wt % of cyclohexanone, 11.5 wt % of MEK, and 3.0 wt % of dicyandiamide were dispersed and mixed to obtain a curable conductive adhesive composition.

The curable conductive adhesive composition was coated on a surface of the silver (Ag) metal layer by using a slot die coater, followed by drying at a temperature of 150° C. for 5 minutes, thereby forming a conductive adhesive layer with a thickness of 13 μm. Then, a second release film (release force; 250 gf/in) as a second protective film was laminated on the conductive adhesive layer, thereby manufacturing an EMI shielding film.

Comparative Example 3

18.0 wt % of bisphenol A epoxy resin, 7.2 wt % of phenoxy epoxy resin, 6.0 wt % of rubber-modified epoxy resin, 4.8 wt % of aluminum hydroxide, 3.6 wt % of dicyandiamide, 0.6 wt % of carbon black, 30 wt % of polyester resin, 8.0 wt % of silica, 15 wt % of cyclohexanone, and 6.8 wt % of MEK were mixed and dissolved to prepare an insulating layer coating solution.

The insulating layer coating solution was coated on a first release film (release force 250 gf/in), which are non-silicon base and matte, as a first protective film, by using a microgravure coater, followed by drying at a temperature of 150° C. for 5 minutes, thereby forming a B-staged insulating layer with a thickness of 5 μm.

A nickel (Ni) layer with a thickness of 0.1 μm as a metal layer was formed on the insulating layer by using a vacuum sputtering equipment.

20.0 wt % of polyester resin, 20.0 wt % of bisphenol A epoxy resin, 5.0 wt % of Ag flake type powder, 10.0 wt % of Ag spherical particle powder, 30.0 wt % of cyclohexanone, 12.0 wt % of MEK, and 3.0 wt % of dicyandiamide were dispersed and mixed to obtain a curable conductive adhesive composition.

The curable conductive adhesive composition was coated on a surface of the silver (Ag) metal layer by using a slot die coater, followed by drying at a temperature of 150° C. for 5 minutes, thereby forming a conductive adhesive layer with a thickness of 13 μm. Then, a second release film (release force; 250 gf/in) as a second protective film was laminated on the conductive adhesive layer, thereby manufacturing an EMI shielding film.

These constitutions of the EMI shielding films according to examples 1 to 4 and comparative examples 1 to 3 are shown in Table 1.

TABLE 1

| | | Example 1 | Example 2 | Example 3 | Example 4 | Comparative Example 1 | Comparative Example 2 | Comparative Example 3 |
|---|---|---|---|---|---|---|---|---|
| First Protective Film (50 μm) | Adhesive Strength (gf/in) | 200 | 200 | 200 | 200 | 250 | 150 | 250 |
| Insulating Layer | Epoxy Resin | 31.2 | 31.2 | 31.2 | 31.2 | 31.2 | 31.2 | 31.2 |
| | Aluminum Hydroxide | 4.8 | 4.8 | 4.8 | 4.8 | 4.8 | 4.8 | 4.8 |
| | Dicyandiamide | 3.6 | 3.6 | 3.6 | 3.6 | 3.6 | 3.6 | 3.6 |
| | Polyester Resin | 20 | 30 | 30 | 30 | 30 | 30 | 30 |
| | Polyurethane Resin | 10 | — | — | — | — | — | — |
| | Carbon Black | 0.6 | 0.6 | 0.6 | 0.6 | 0.6 | 0.6 | 0.6 |
| | Silica | 3.0 | 8.0 | 8.0 | 8.0 | — | 8.0 | 8.0 |
| | Solvent | 26.8 | 21.8 | 21.8 | 21.8 | 29.8 | 21.8 | 21.8 |
| | Thickness(μm) | 5 | 5 | 5 | 10 | 5 | 30 | 5 |
| Metal Layer | Ag coating thickness | 0.3 μm | 0.3 μm | 0.3 μm | 0.3 μm | 0.1 μm | 0.3 μm | — |
| | Ni Sputtering thickness | — | — | — | — | — | — | 0.1 μm |

TABLE 1-continued

|  |  | Example 1 | Example 2 | Example 3 | Example 4 | Comparative Example 1 | Comparative Example 2 | Comparative Example 3 |
|---|---|---|---|---|---|---|---|---|
| Conductive Adhesive Layer | Polyester Resin | 20 | 20 | 10 | 10 | 20 | 10 | 20 |
|  | Bisphenol A Epoxy Resin | 20 | 20 | 30 | 30 | 20 | 30 | 20 |
|  | Ag Flake Type Powder | 5 | 10 | — | 15 | 15 | 5 | 5 |
|  | Ag Spherical Particle Powder | 10 | 5 | 15 | — | — | 10 | 10 |
|  | Metal Adhesion Improver | 2 | 2 | 2 | 2 | — | 0.5 | — |
|  | Hardener | 3 | 3 | 3 | 3 | 3 | 3 | 3 |
|  | Solvent | 40 | 40 | 40 | 40 | 42 | 41.5 | 42 |
|  | Thickness(μm) | 13 | 13 | 13 | 13 | 8 | 13 | 13 |
| Second Protective Film (50 μm) | Adhesive Strength (gf/in) | 250 | 250 | 250 | 250 | 250 | 250 | 250 |
| Total Thickness (μm) |  | 118.3 | 118.3 | 118.3 | 123.3 | 113.1 | 143.3 | 118.1 |

The EMI shielding films according to examples 1 to 4 and comparative examples 1 to 3 were tested as follows, and then the results were tabulated in Table 2.

<Evaluation on EMI Shielding Films>

1) Metal Layer—Conductive Adhesive Layer Peel Strength (kgf/cm)

After removal of the second protective film, a PI film (Kapton) of 25 μm was attached on a surface of the conductive adhesive layer of the EMI shielding film, followed by 80 degree laminating, thereby delaminating the first protective film.

A PI film of 25 μm as a bonding sheet was attached on a surface of the insulating layer from which the first protective film is delaminated, and then compressed under conditions of 170° C. 45 kgf, and 70 minutes, to C-stage the insulating layer of B-stage.

After compression, 180 degree peel test was performed at a tensile speed of 58.8 m/min under the surroundings of a temperature of 23° C. and a relative humidity of 50%. Adhesive strength values between the conductive adhesive layer and the metal layer were measured, and the average value thereof was determined as an adhesive strength (kgf/cm).

2) Solder Heat Resistance

The EMI shielding film was attached on a PI film (Kapton) of 25 μm, and subjected to hot press (temperature=170° C., pressure=45 Kgf, time=70 minutes). The resultant sample was floated in solder (15 seconds, 280° C.), and observed by the naked eyes. It was evaluated whether bad external appearance, such as foaming, peeling, or delaminating, occurs or not. Five tests were performed on every example and comparative example, and the solder heat resistance was evaluated by the number of times which the bad external appearance occurs.

*NG: Number of times which bad external appearance occurs is one or more.

Pass: Bad external appearance does not occur

3) Flex Resistance Test: Times

Test was performed according to JIS-C6471. Each sample was measured by using a prescribed circuit (L/S 100/100) prepared by etching, under conditions of Curvature Radius R=0.38 mm, Angle=135 degrees, load=500 gf, and Test speed=175 cpm.

4) Slide Phone Cable Test: Times

Test was performed by using a Slide Cycle Tester (Tera System Inc.). Each sample was measured by using a prescribed circuit (L/S 100/100) prepared by etching, under conditions of Curvature Radius R=0.65 mm, Speed=60 cpm, and Stroke=45 mm.

5) Measurement of EMI Shielding Effectiveness

Measurement frequency range of 30 MHz to 1 GHz, measurements in vertical and horizontal directions (using antenna coupon), and measurement distance of 3M (inside of EMI completely shielding chamber) were set.

6) Peelability Between First Protective Film and Insulating Layer

The EMI shielding film was attached on a PI film (Kapton) of 25 μm, and subjected to hot press (temperature=170° C., pressure=45 Kgf, time=70 minutes). Then, when the first protective film was peeled off the insulating layer by hand, the extent of peel was marked.

*X: badly peeled off (No Good), Δ: easily peeled off (Moderate), O: suitably peeled off (Good)

TABLE 2

|  | Example 1 | Example 2 | Example 3 | Example 4 | Comparative Example 1 | Comparative Example 2 | Comparative Example 3 |
|---|---|---|---|---|---|---|---|
| Metal Layer-Conductive Adhesive Layer Peel Strength | 0.6 | 0.6 | 0.6 | 0.6 | 0.3 | 0.4 | 0.2 |
| Solder Heat Resistance | Pass | Pass | Pass | Pass | Pass | Pass | Pass |
| Flex Resistance(Times) | 9,000 | 9,000 | 9,000 | 9,000 | 9,000 | 6,000 | 7,000 |
| Slide Flexibility(Times) | >200,000 | >250,000 | >250,000 | >250,000 | >200,000 | 150,000 | 150,000 |
| EMI shielding effectiveness(dB) | 58 | 58 | 58 | 58 | 55 | 58 | 53 |
| Peelability between First Protective Film and Insulating Layer | o | o | o | o | x | Δ | x |

As shown in Tables 1 and 2, the present invention can provide an EMI shielding film having superior EMI shielding efficiency of circuits, and excellent high flexibility, chemical resistance, and tearing-resistance, in a field of electronic devices.

INDUSTRIAL APPLICABILITY

In the present invention, in a case where the metal layer is formed through a coating method by using a silver (Ag) ink coating solution, peel problems with the insulating layer and deteriorated flexibility problems, which result from forming the metal layer by the existing methods such as sputtering or deposition, can be solved. More specifically, in a case where the silver (Ag) ink coating solution infiltrates into the insulating layer in B-stage and then is subjected to firing, the metal layer can maintain a high peel strength, and thus, it can be prevented from being torn due to the peeling-off between layers at the time of FPCB processing. In addition, in a case where the metal layer is formed through a coating method by using a silver (Ag) ink coating solution, productivity can be improved as compared with the existing methods.

In the present invention, in a case where the conductive adhesive layer contains silver (Ag) having excellent conductivity and a polyester resin having excellent adhesive strength with the metal layer, it can have high flexibility and high conductivity.

The invention claimed is:

1. A method for manufacturing an electromagnetic interference (EMI) shielding film, comprising:
    (a) providing a single insulating layer on a first protective film, the insulating layer being made of an insulating layer composition including at least one resin selected from a thermoplastic resin and a thermosetting resin and at least one filler selected from a flame-retardant filler and an abrasion-resistant filler;
    (b) providing a metal layer on the insulating layer;
    (c) providing a conductive adhesive layer on the metal layer, the conductive adhesive layer being made from a conductive adhesive layer composition including at least one resin selected from a thermoplastic resin and a thermosetting resin, and a conductive filler; and
    (d) providing a second protective film on the conductive adhesive layer.

2. The method of claim 1, wherein the first protective film of step (a) is a matte release film.

3. The method of claim 1, wherein the first protective film of step (a) has a thickness of 35 to 90 µm and an adhesive strength of 180 gf/in to 250 gf/in.

4. The method of claim 1, wherein the insulating layer composition of step (a) further includes a supplemental additive and a solvent, and the insulating layer composition of step (a) contains 10 to 80 wt % of the resin, 2 to 20 wt % of the filler, 0.5 to 10 wt % of the supplemental additive, and 5 to 80 wt % of the solvent, based on total 100 wt % thereof.

5. The method of claim 1, wherein the flame-retardant filler includes at least one selected from aluminum hydroxide, a phosphorous compound, zinc hydroxide, and calcium hydroxide, and the abrasion-resistant filler includes at least one selected from titanium hydroxide, silica, zirconium oxide, and zinc oxide.

6. The method of claim 1, wherein step (a) includes:
    (a1) preparing the insulating layer composition;
    (a2) coating the insulating layer composition on the first protective film to form a coating layer; and
    (a3) drying the coating layer to form the insulating layer in B-stage on the first protective film.

7. The method of claim 1, wherein the insulating layer in step (a) has a thickness of 3 µm to 20 µm.

8. The method of claim 1, wherein the metal layer in step (b) is formed of a silver (Ag) ink coating solution, and silver (Ag) ink coating solution contains a silver chelate compound obtained by reacting at least one silver compound of chemical formula 1 below and at least one ammonium carbamate-based compound or ammonium carbonate-based compound selected from chemical formulas 2 to 4 below wherein in the chemical formulas, X represents a substituent selected from oxygen, sulfur, halogen, cyano, cyanate, carbonate, nitrate, nitrite, sulfate, phosphate, thiocyanate, chlorate, perchlorate, tetrafluoroborate, acetylacetonate, carboxylate and derivatives thereof, n represents an integer of 1 to 4, and each of R1 to R6 represents independently hydrogen, C1-C30 aliphatic or cycloaliphatic alkyl, aryl or aralkyl group, alkyl or aryl group substituted with functional group(s), and a substituent selected from a heterocyclic compound, a high molecular compound and a derivative thereof, but R1 to R6 are not all hydrogen.

9. The method of claim 8, wherein step (b) includes:
    (b1) preparing the silver (Ag) ink coating solution;
    (b2) coating the silver (Ag) ink coating solution on the insulating layer; and
    (b3) performing firing to form the metal layer on the insulating layer after step (b2).

10. The method of claim 1, wherein the metal layer has a thickness of 0.05 µm to 0.4 µm.

11. The method of claim 1, wherein the conductive adhesive layer composition further includes a solvent, and the conductive adhesive layer composition contains 10 to 60 wt % of the resin, 10 to 30 wt % of the conductive filler, and 30 to 60 wt % of the solvent, based on total 100 wt % thereof.

12. The method of claim 1, wherein the conductive adhesive layer composition further includes a supplemental additive and a solvent, and the conductive adhesive layer composition contains 10 to 60 wt % of the resin, 10 to 30 wt % of the conductive filler, 1 to 7 wt % of the supplemental additive, and 29 to 60 wt % of the solvent, based on total 100 wt % thereof.

13. The method of claim 12, wherein as the supplemental additive, at least one selected from a metal adhesion improver and a thermosetting agent is used, and the metal adhesion improver is contained in 1 to 5 wt %.

14. The method of claim 1, wherein the conductive filler in the conductive adhesive layer composition includes at least one selected from a silver (Ag) spherical particle powder and a silver (Ag) flake type powder.

15. The method of claim 1, wherein step (c) includes:
(c1) preparing the conductive adhesive layer composition;
(c2) coating the conductive adhesive layer composition on the metal layer to form the conductive adhesive layer; and
(c3) drying the conductive adhesive layer to form a conductive adhesive layer in B-stage on the metal layer.

16. The method of claim 1, wherein the conductive adhesive layer has a thickness of 5 μm to 20 μm.

17. The method of claim 15, wherein the second protective film is provided on the conductive adhesive layer by coating the conductive adhesive layer composition on the conductive metal layer and then laminating the second protective film thereon.

* * * * *